(12) United States Patent
Brandl et al.

(10) Patent No.: US 10,049,967 B2
(45) Date of Patent: Aug. 14, 2018

(54) METHOD OF PRODUCING AN OPTOELECTRONIC COMPONENT AND OPTOELECTRONIC COMPONENT

(71) Applicant: OSRAM Opto Semiconductors GmbH, Regensburg (DE)

(72) Inventors: Martin Brandl, Kelheim (DE); Ion Stoll, Tegernheim (DE); Michael Wittmann, Alteglofsheim (DE)

(73) Assignee: OSRAM Opto Semiconductors GmbH (DE)

( * ) Notice: Subject to any disclaimer, the term of this patent is extended or adjusted under 35 U.S.C. 154(b) by 0 days.

(21) Appl. No.: 15/737,525

(22) PCT Filed: Jun. 16, 2016

(86) PCT No.: PCT/EP2016/063874
§ 371 (c)(1),
(2) Date: Dec. 18, 2017

(87) PCT Pub. No.: WO2016/202917
PCT Pub. Date: Dec. 22, 2016

(65) Prior Publication Data
US 2018/0114744 A1    Apr. 26, 2018

(30) Foreign Application Priority Data

Jun. 19, 2015   (DE) .................. 10 2015 109 876

(51) Int. Cl.
*H01L 33/00*      (2010.01)
*H01L 23/495*     (2006.01)
(Continued)

(52) U.S. Cl.
CPC .... *H01L 23/49541* (2013.01); *H01L 25/0753* (2013.01); *H01L 25/167* (2013.01);
(Continued)

(58) Field of Classification Search
CPC .......... H01L 23/49541; H01L 25/0753; H01L 25/167; H01L 31/0203; H01L 33/486;
(Continued)

(56) References Cited

U.S. PATENT DOCUMENTS

2005/0116235 A1   6/2005  Schultz et al.
2006/0180925 A1   8/2006  Lee et al.
(Continued)

FOREIGN PATENT DOCUMENTS

DE   10 2010 024 864 A1   12/2011
DE   10 2012 212 968 A1   1/2014
(Continued)

*Primary Examiner* — Elias M Ullah
(74) *Attorney, Agent, or Firm* — DLA Piper LLP (US)

(57) ABSTRACT

A method of producing an optoelectronic component includes providing a lead frame having an upper side including a contact region and a chip reception region raised relative to the contact region; arranging an electrically conductive element on the contact region; embedding the lead frame in a molded body, wherein the contact region is covered by the molded body, and the chip reception region and the electrically conductive element remain accessible on an upper side of the molded body; arranging an optoelectronic semiconductor chip on the chip reception region; and connecting the optoelectronic semiconductor chip and the electrically conductive element by a bonding wire.

14 Claims, 8 Drawing Sheets

(51) Int. Cl.
*H01L 33/62* (2010.01)
*H01L 33/48* (2010.01)
*H01L 25/16* (2006.01)
*H01L 33/60* (2010.01)
*H01L 25/075* (2006.01)
*H01L 33/50* (2010.01)
*H01L 31/0203* (2014.01)

(52) U.S. Cl.
CPC ........ *H01L 31/0203* (2013.01); *H01L 33/486* (2013.01); *H01L 33/505* (2013.01); *H01L 33/60* (2013.01); *H01L 33/62* (2013.01); *H01L 2224/48247* (2013.01); *H01L 2924/12041* (2013.01); *H01L 2933/0066* (2013.01)

(58) Field of Classification Search
CPC ......... H01L 33/505; H01L 2224/48247; H01L 2924/12041
See application file for complete search history.

(56) References Cited

U.S. PATENT DOCUMENTS

2008/0012036 A1 1/2008 Loh et al.
2012/0300491 A1 11/2012 Hussell et al.

FOREIGN PATENT DOCUMENTS

METHOD OF PRODUCING AN OPTOELECTRONIC COMPONENT AND OPTOELECTRONIC COMPONENT

TECHNICAL FIELD

This disclosure relates to a method of producing optoelectronic components and optoelectronic components.

BACKGROUND

Optoelectronic components comprising a housing with a lead frame embedded in a housing body are known. The lead frame may have a metal coating to increase optical reflectivity and/or aging stability of the lead frame.

SUMMARY

We provide a method of producing an optoelectronic component including providing a lead frame having an upper side including a contact region and a chip reception region raised relative to the contact region; arranging an electrically conductive element on the contact region; embedding the lead frame in a molded body, wherein the contact region is covered by the molded body, and the chip reception region and the electrically conductive element remain accessible on an upper side of the molded body; arranging an optoelectronic semiconductor chip on the chip reception region; and connecting the optoelectronic semiconductor chip and the electrically conductive element by a bonding wire.

We also provide an optoelectronic component including a carrier and an optoelectronic semiconductor chip, wherein the carrier includes a lead frame embedded in a molded body, the lead frame includes an upper side having a contact region and a chip reception region raised relative to the contact region, an electrically conductive element is arranged on the contact region, the contact region is covered by the molded body, the chip reception region and the electrically conductive element are accessible on an upper side of the molded body, and the optoelectronic semiconductor chip is arranged on the chip reception region and connects to the electrically conductive element by a bonding wire.

LIST OF REFERENCES 10 optoelectronic component
100 carrier
101 upper side
102 lower side
200 molded body
201 upper side
202 lower side
210 cavity
300 lead frame
301 upper side
302 lower side
310 first lead frame section
311 upper side
312 lower side
320 second lead frame section
321 upper side
322 lower side
330 contact region
335 recess
336 bonding medium
340 chip reception region
345 undercut
350 further chip reception region
400 electrically conductive element
410 first height
420 second height
500 optoelectronic semiconductor chip
501 upper side
502 lower side
510 first electrical contact pad
520 second electrical contact pad
600 bonding wire
700 protective chip
701 upper side
702 lower side

DETAILED DESCRIPTION

Our method of producing an optoelectronic component comprises a step of providing a lead frame having an upper side comprising a contact region and a chip reception region raised relative to the contact region, arranging an electrically conductive element on the contact region, embedding the lead frame in a molded body, wherein the contact region is covered by the molded body, and the chip reception region and the electrically conductive element remain accessible on an upper side of the molded body, arranging an electronic semiconductor chip on the chip reception region, and connecting the optoelectronic semiconductor chip and the electrically conductive element by a bonding wire.

Advantageously, in this method the lead frame is covered in the contact region by the molded body, and thereby protected against aging due to environmental influences. Since the lead frame is protected in the contact region by the material of the molded body, under certain circumstances a coating of the lead frame used for corrosion protection may be obviated In this way, improved bonding of the material of the molded body to the uncoated lead frame may be obtained as an additional advantage.

Due to covering the contact region of the lead frame by the molded body, a high optical reflectivity can be achieved so that the optoelectronic component obtainable by the method can have a high efficiency. The high optical reflectivity may in this case be achieved without an expensive aging-susceptible coating of the lead frame.

Due to covering the contact region of the lead frame by the molded body, a large contact area is formed between the lead frame and the molded body. This can advantageously increase the mechanical stability of the optoelectronic component obtainable by the method, and in particular reduce the risk that the molded body and the lead frame will separate from one another in the course of the lifetime of the optoelectronic component obtainable by the method.

The electrically conductive element may be arranged on the contact region such that it protrudes beyond the chip reception region. In this case, the electrically conductive element is pressed flat before the embedding the lead frame in the molded body such that the electrically conductive element has the same height as the chip reception region. Advantageously, in this way it is straightforwardly possible to achieve the effect that the electrically conductive element and the chip reception region have the same height relative to the contact region. Possible tolerances can thereby be compensated for straightforwardly by the method.

Pressing the electrically conductive element flat may be carried out by a closure pressure of a molding tool. Advantageously, pressing the electrically conductive element flat therefore does not require a separate method step, which makes it possible to carry out the method simply and rapidly.

The electrically conductive element may be arranged in a recess provided in the contact region. Advantageously, the lateral position of the electrically conductive element can thereby be established reliably in a simple manner. Due to arrangement of the electrically conductive element in the recess provided in the contact region, fixing the electrically conductive element can already be achieved before embedding the electrically conductive element in the molded body so that the method can be carried out particularly simply and reliably.

The electrically conductive element may be fixed on the contact region by an electrically conductive bonding medium. In this way, fixing the electrically conductive element on the contact region of the lead frame can already be achieved before embedding the electrically conductive element in the molded body so that the method can advantageously be carried out particularly simply and reliably. Due to fixing of the electrically conductive element on the contact region by an electrically conductive bonding medium, a reliable electrically conductive connection is furthermore ensured between the electrically conductive element and the contact region of the lead frame.

The lead frame may be provided having a first lead frame section and a second lead frame section. In this case, an electrically conductive element is respectively arranged on the upper side of the first lead frame section and on the upper side of the second lead frame section. The two electrically conductive elements connect to the optoelectronic semiconductor chip via bonding wires. Advantageously, the two lead frame sections of the lead frame can then be used for electrical contacting of the optoelectronic semiconductor chip in the optoelectronic component obtainable by this method.

The method may comprise a further step of arranging a protective chip on the upper side of the lead frame. The protective chip in this case is embedded in the molded body. The protective chip may be used to protect the optoelectronic semiconductor chip against damage by electrostatic discharges in the optoelectronic component obtainable by this method. Due to embedding of the protective chip in the molded body, it is advantageously protected against damage by external effects, and does not require any additional installation space. This makes it possible to configure the optoelectronic component obtainable by the method with compact external dimensions. Embedding the protective chip in the molded body furthermore offers the advantage that the embedded protective chip cannot absorb any emitted light, which results in a higher efficiency.

Our optoelectronic component comprises a carrier and an optoelectronic semiconductor chip. The carrier in this case comprises a lead frame embedded in a molded body. The lead frame comprises an upper side having a contact region and a chip reception region raised relative to the contact region. An electrically conductive element is arranged on the contact region. The contact region is covered by the molded body. The chip reception region and the electrically conductive element are accessible on an upper side of the molded body. The optoelectronic semiconductor chip is arranged on the chip reception region and connects to the electrically conductive element by a bonding wire.

Advantageously, the lead frame of this optoelectronic component is protected against aging, for instance by corrosion, by covering the contact region of the lead frame.

The molded body may have a high optical reflectivity so that a high optical reflectivity can also be achieved in the contact region, next to the optoelectronic semiconductor chip, of the lead frame. In this way, the optoelectronic component can have a high efficiency.

Due to covering of the contact region of the lead frame by the molded body, in this optoelectronic component a large contact area is formed between the lead frame and the molded body so that the optoelectronic component can have a high mechanical stability. Due to the large contact area between the lead frame and the molded body, there is advantageously only a small risk of separation of the molded body and the lead frame from one another even under the influence of thermal expansions.

The chip reception region may be flush with a section of the upper side of the molded body. Advantageously, there is therefore no step, at which shadowing and reflections may occur, in the edge region of the chip reception region.

The chip reception region may have an undercut at the boundary with the contact region. Advantageously, particularly reliable mechanical anchoring of the lead frame in the molded body of the optoelectronic component can thereby be achieved.

The molded body may form a cavity on its upper side. In this case, the optoelectronic semiconductor chip is arranged in the cavity. Advantageously, the cavity, formed by the molded body, of this optoelectronic component can act as an optical reflector to collect electromagnetic radiation emitted by the optoelectronic semiconductor chip of the optoelectronic component. In addition, the cavity may also be filled with an encapsulation material, in which the optoelectronic semiconductor chip is embedded. This encapsulation material may protect the optoelectronic semiconductor chip against damage by external effects. Furthermore, the encapsulation material may comprise embedded wavelength-converting particles to convert electromagnetic radiation emitted by the optoelectronic semiconductor chip at least partially into electromagnetic radiation of another wavelength.

The lead frame may be accessible on a lower side, lying opposite the upper side, of the molded body. Advantageously, the part, accessible on the lower side of the molded body of this optoelectronic component, of the lead frame may be used as an electrical contact pad for electrical contacting of the optoelectronic component. The optoelectronic component may, for example, be suitable as an SMD component for surface mounting, for example, for surface mounting by reflow soldering.

The optoelectronic component may comprise a further optoelectronic semiconductor chip. In this way, the optoelectronic component may, for example, be suitable for emitting electromagnetic radiation with a particularly high power.

The lead frame may comprise a further chip reception region raised relative to the contact region. In this case, the further optoelectronic semiconductor chip is arranged on the further chip reception region. The optoelectronic component may therefore, for example, be suitable for generating electromagnetic radiation with high power. In this case, all parts of the upper side of the lead frame which are not covered by the optoelectronic semiconductor chip may advantageously be covered by the material of the molded body so that the optoelectronic component can have a high optical reflectivity and, therefore, a high efficiency.

The above-described properties, features and advantages, as well as the way in which they are achieved, will become more clearly and readily comprehensible in conjunction with the following description of the examples, which will be explained in more detail in connection with the drawings.

Figure 1:
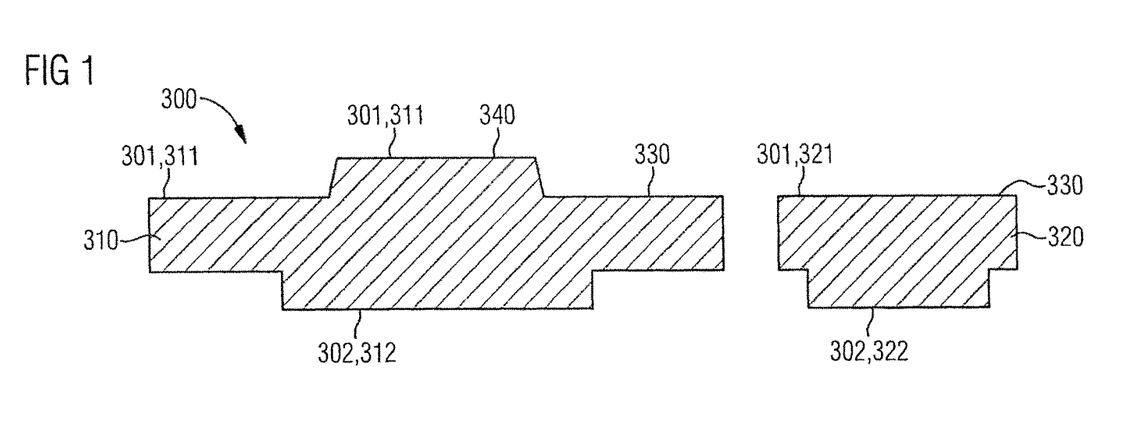
FIG. 1 schematically shows a sectional side view of two lead frame sections of a lead frame.

FIG. 1 shows a schematic sectional side view of a first lead frame section 310 and a second lead frame section 320 of a lead frame 300.

The lead frame 300 is configured as an essentially flat plate having an upper side 301 and a lower side 302 lying opposite the upper side 301. The lead frame 300 has openings extending between its upper side 301 and its lower side 302 and separate the individual lead frame sections 310, 320 from one another. The lead frame 300 may comprise further lead frame sections not represented in FIG. 1.

The lead frame 300 comprises an electrically conductive material, for example, a metal. The lead frame 300 may, for example, comprise copper. The lead frame 300 may have a coating on its upper side 301 and/or on its lower side 302 and/or in its openings, for example, a coating of Ag, NiPdAu, NiPdAg, NiAu, Ni, or another metal, or another alloy. The layer thickness may, for example, be 10 nm to 10 µm. The coating may, for example be applied by electroplating, by sputtering, by CVD or by PVD. The coating may also extend only over parts of the upper side 301 or the lower side 302 of the lead frame 300.

The first lead frame section 310 has an upper side 311 and a lower side 312 lying opposite the upper side 311. The second lead frame section 320 has an upper side 321 and a lower side 322 lying opposite the upper side 321. The upper side 311 of the first lead frame section 310 and the upper side 321 of the second lead frame section 320 form a part of the upper side 301 of the lead frame 300. The lower side 312 of the first lead frame section 310 and the lower side 322 of the second lead frame section 320 form a part of the lower side 302 of the lead frame 300. The upper sides 311, 321 and the lower sides 312, 322 of the lead frame sections 310, 320 of the lead frame 300 may respectively have elevations and depressions. The elevations and depressions of the upper side 301 and the lower side 302 of the lead frame 300, as well as the openings in the lead frame 300 may, for example, be applied by embossing or etching.

The upper side 311 of the first lead frame section 310 has a contact region 330 and a chip reception region 340 raised relative to the contact region 330. In the example represented, the chip reception region 340 is bordered by the contact region 330. However, the subdivision of the upper side 311 of the first lead frame section 310 into the contact region 330 and the chip reception region 340 may also be configured differently.

The upper side 321 of the second lead frame section 320 likewise forms a contact region 330, but it does not have a chip reception region 340. The contact region 330 of the upper side 321 of the second lead frame section 320 is arranged in a common plane with the contact region 330 of the upper side 311 of the first lead frame section 310.

Figure 2:
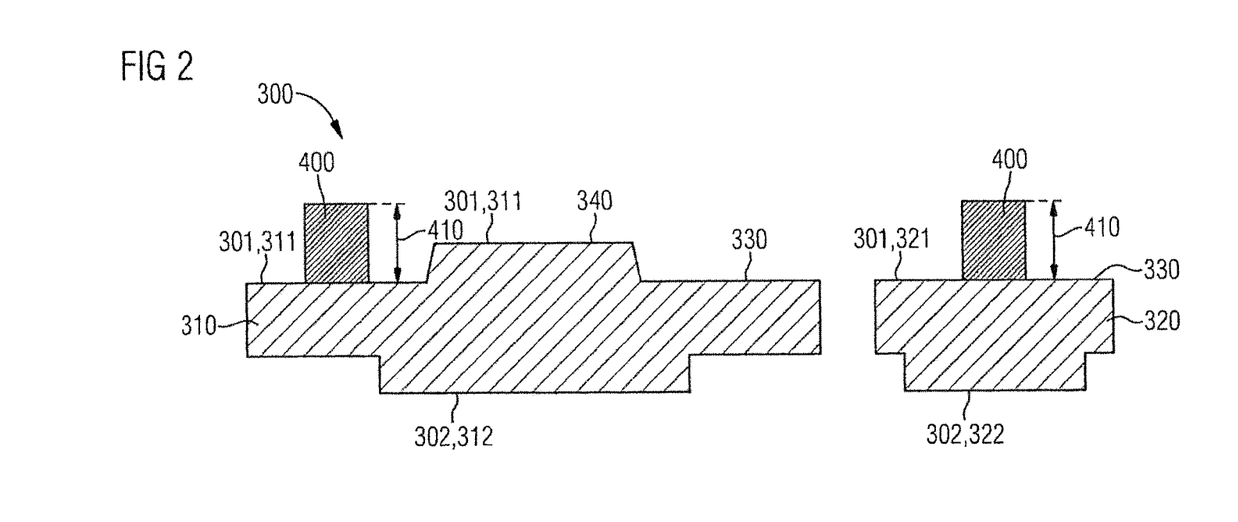
FIG. 2 schematically shows a sectional side view of the lead frame sections with electrically conductive elements arranged on contact regions.

FIG. 2 shows a schematic sectional side view of the lead frame sections 310, 320 in a processing state chronologically following the representation of FIG. 1.

An electrically conductive element 400 has respectively been arranged on the contact regions 330 of the upper sides 311, 321 of the first lead frame section 310 and of the second lead frame section 320. The electrically conductive elements 400 comprise an electrically conductive material, for example, a metal or a metal alloy. In particular, the electrically conductive elements 400 may, for example, comprise Au, Ag or an alloy with Au and/or Ag. The electrically conductive elements 400 may, however, for example, also comprise an electrically conductive plastic. The electrically conductive elements 400 may also comprise a polymer having an electrically conductive filler, for example, a silicone or an epoxide having a filler comprising graphite, graphene or a metallic filler.

The electrically conductive elements 400 may be configured as bumps of a soft material. In this case, the material of the electrically conductive elements 400 preferably has a Mohs hardness of 1.5 to 5. The electrically conductive elements 400 may in this case have a first height 410, in a direction perpendicular to the contact regions 330 of the upper side 301 of the lead frame 300, which is greater than the height by which the chip reception region 340 is raised above the contact regions 330.

Figure 3:
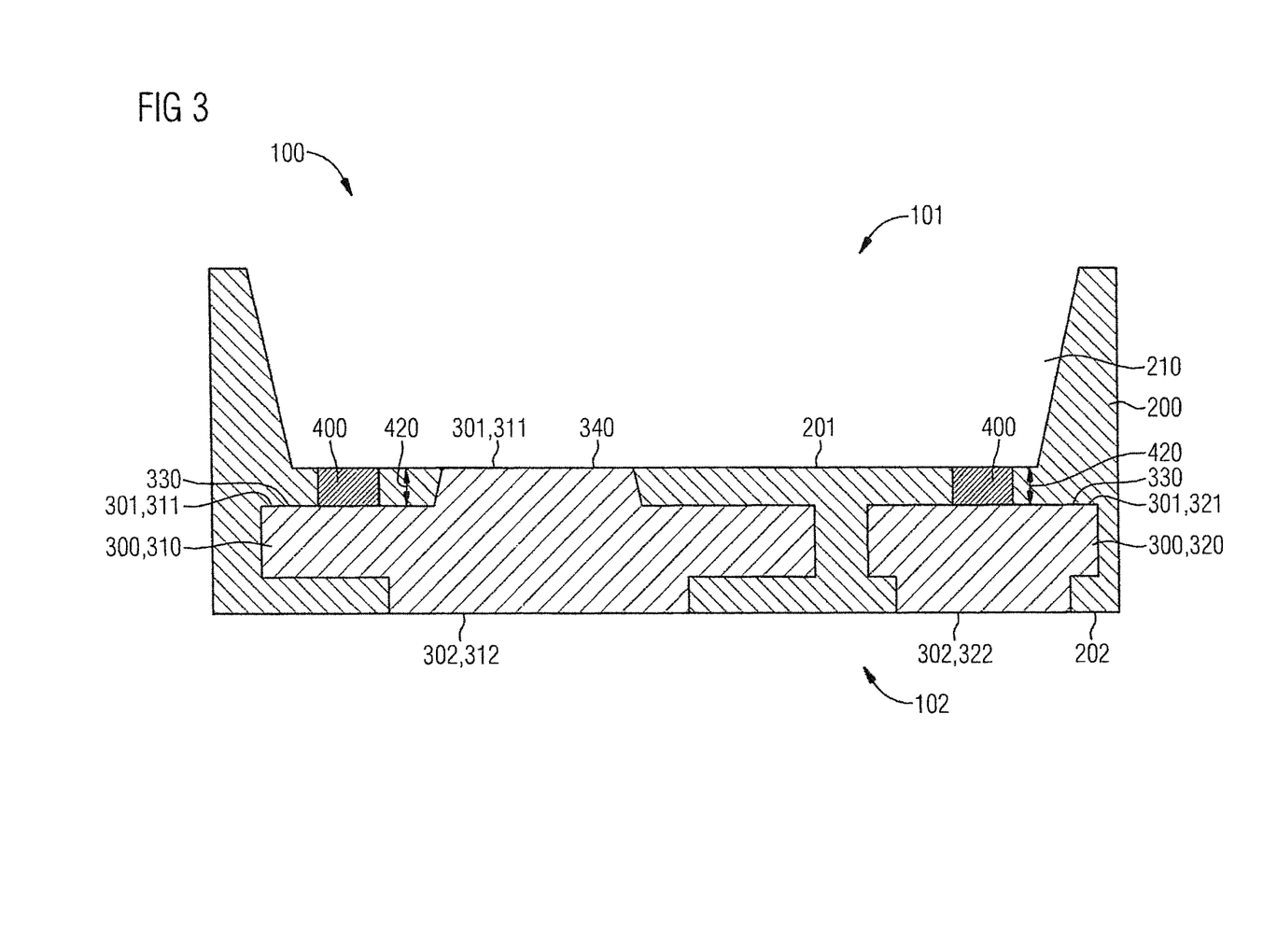
FIG. 3 schematically shows a sectional side view of the lead frame section after its embedding in a molded body.

FIG. 3 shows a schematic sectional side view of the lead frame sections 310, 320 of the lead frame 300 in a processing state chronologically following the representation of FIG. 2.

In a processing step chronologically following the representation of FIG. 2, the lead frame 300 has been arranged in a molding tool. During closure of the molding tool, the electrically conductive elements 400 arranged on the upper sides 311, 321 of the lead frame sections 310, 320 have been pressed flat by a closure pressure of the molding tool so that the electrically conductive elements 400 now have a second height 420, which is less than their original first height 410. The second height 420 corresponds to the height by which the chip reception region 340 is raised above the contact region 330.

Subsequently, the lead frame sections 310, 320 of the lead frame 300 and the electrically conductive elements 400 arranged on the contact regions 330 of the upper sides 311, 321 of the lead frame sections 310, 320 have been embedded in a molded body 200 formed in the molding tool. The molded body 200 may also be referred to as a molding. The molded body 200 has been formed in a molding method, for example, by transfer molding or injection molding. In this case, the lead frame sections 310, 320 and the electrically conductive elements 400 have been molded around at least partially by the material of the molded body 200.

The material of the molded body 200 may, for example, comprise a polymer in particular, for example, a polymer based on a silicone or an epoxide. The material of the molded body 200 may comprise one or more embedded fillers. For example, the material of the molded body 200 may comprise an embedded filler which comprises $SiO_2$, $TiO_2$, $ZrO_2$, $AlSO_3$, $BaSO_4$, an alkali metal titanate, $CaSO_4$, $Y_3Al_5O_{12}$. The material of the molded body 200 may also comprise an embedded filler leading to a non-white color of the molded body 200, for example, graphite or pigments, for example, inorganic pigments, for instance transition metals, rare earth oxides, sulfides, cyanides or halides. The molded body 200 may also comprise an embedded organic dye.

The molded body 200 covers the contact regions 330 of the upper side 311 of the first lead frame section 310 and of the upper side 321 of the second lead frame section 320. The molded body 200, however, covers the chip reception region 340 of the upper side 311 of the first lead frame section 310 and the electrically conductive elements 400 at least not fully so that the electrically conductive elements 400 and the chip reception region 340 remain accessible on an upper side 201 of the molded body 200. The chip reception region 340 is in this case flush with a section of the upper side 201 of the molded body 200.

The lower side 312 of the first lead frame section 310 and the lower side 322 of the second lead frame section 320 are likewise covered at least not fully by the molded body 200. The lower sides 312, 322 of the lead frame sections 310, 320 are therefore accessible on a lower side 202, lying opposite the upper side 201, of the molded body 200 and are flush with the lower side 202 of the molded body 200.

It may be necessary to remove residues of the material of the molded body 200 (deflashing) from the chip reception region 340 of the upper side 311 of the first lead frame section 310 and/or the lower sides 312, 322 of the lead frame sections 310, 320 in a further processing step after the formation of the molded body 200. It is, however, likewise possible to cover the mold cores of the tool during the molding method with a soft protective film (film-assisted transfer molding). In this way, significantly better sealing can be achieved and flash can be avoided. A deflashing process can thereby be avoided.

The molded body 200 forms a cavity 210 on its upper side 201. The chip reception region 340 of the first lead frame section 310 and the electrically conductive elements 400 are accessible in a bottom region of the cavity 210 on the upper side 201 of the molded body 200.

The molded body 200 and the lead frame sections 310, 320 of the lead frame 300 which are embedded in the molded body 200 together form a carrier 100. The upper side 201 of the molded body 200 and the chip reception region 340, exposed on the upper side 201 of the molded body 200, of the upper side 311 of the first lead frame section 310 together form an upper side 101 of the carrier 100. The lower side 202 of the molded body 200 and the lower sides 312, 322, which are exposed on the lower side 202 of the molded body 200, of the lead frame sections 310, 320 together form a lower side 102 of the carrier 100.

Figure 4:
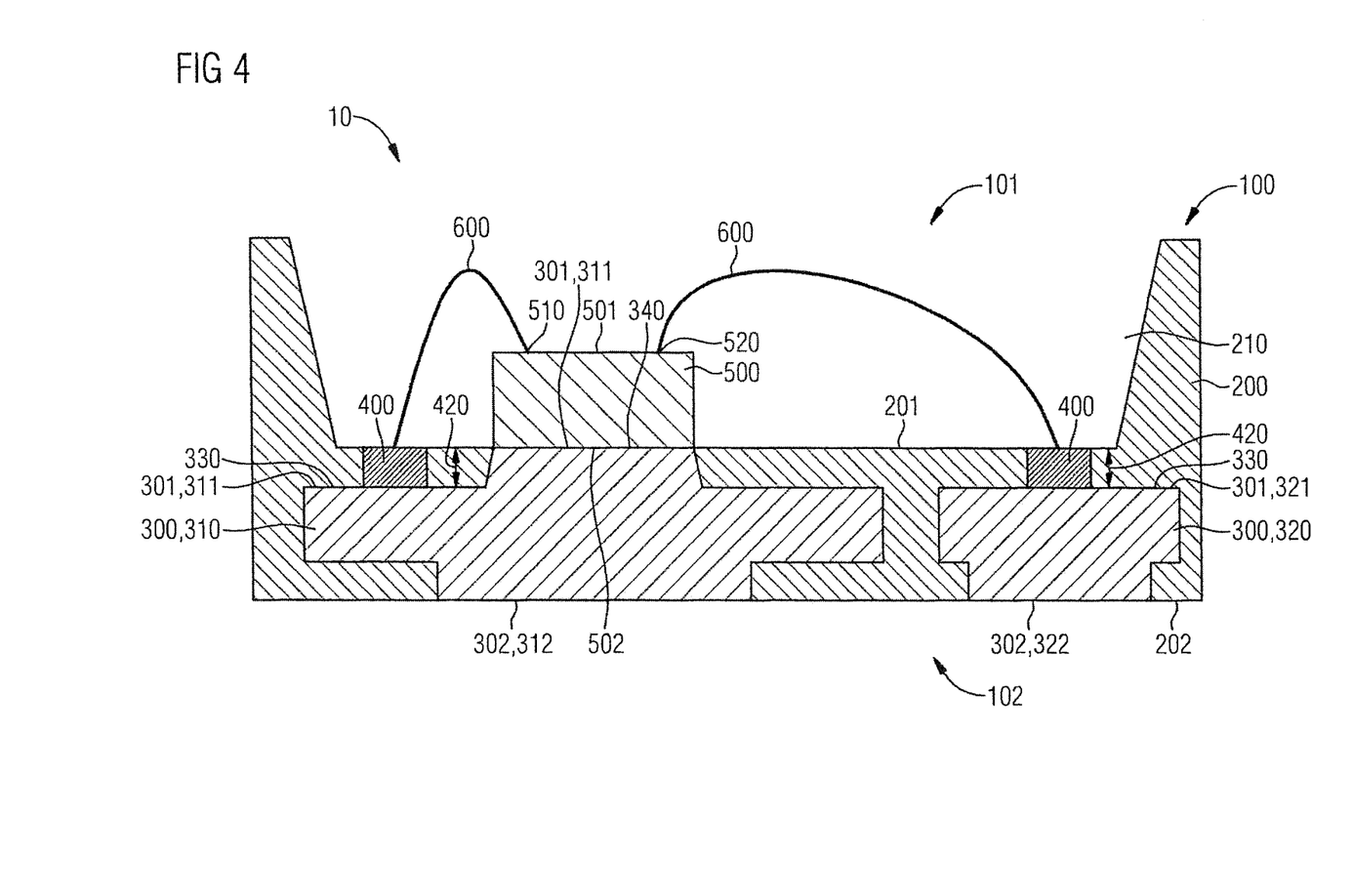
FIG. 4 schematically shows a sectional side view of an optoelectronic component formed from the lead frame sections and the molded body.

FIG. 4 shows a schematic sectional side view of the molded body 200 with the lead frame sections 310, 320 embedded in the molded body 200 in a processing state chronologically following the representation of FIG. 3. An optoelectronic component 10 has been formed by further processing steps.

In a processing step chronologically following the representation of FIG. 3, an optoelectronic semiconductor chip 500 has been arranged on the chip reception region 340 of the upper side 311 of the first lead frame section 310. The optoelectronic semiconductor chip 500 is therefore arranged in the cavity 210 formed on the upper side 201 of the molded body 200. The optoelectronic semiconductor chip 500 may, for example, be a light-emitting diode chip (LED chip), and is configured to emit electromagnetic radiation, for example, visible light. The optoelectronic semiconductor chip 500 may, for example, be a volume-emitting or surface-emitting semiconductor chip. In particular, the optoelectronic semiconductor chip 500 may be configured as a sapphire volume emitter chip.

The optoelectronic semiconductor chip 500 has an upper side 501 and a lower side 502 lying opposite the upper side 501. If the optoelectronic semiconductor chip 500 is configured as a surface-emitting semiconductor chip, the upper side 501 forms a radiation emission face of the optoelectronic semiconductor chip 500. On its upper side 501, the optoelectronic semiconductor chip 500 has a first electrical contact pad 510 and a second electrical contact pad 520.

The optoelectronic semiconductor chip 500 is arranged on the chip reception region 340 of the upper side 311 of the first lead frame section 310 such that the lower side 502 of the optoelectronic semiconductor chip 500 faces toward the chip reception region 340. The optoelectronic semiconductor chip 500 may, for example, be fastened on the chip reception region 340 by an adhesive or a solder or by Ag sintering.

The first electrical contact pad 510 electrically conductively connects via a bonding wire 600 to the electrically conductive element 400 exposed on the upper side 201 of the molded body 200, this electrically conductive element being arranged on the contact region 330 of the upper side 311 of the first lead frame section 310. The second electrical contact pad 520 of the optoelectronic semiconductor chip 500 electrically conductively connects via a further bonding wire 600 to the electrically conductive element 400 exposed on the upper side 201 of the molded body 200, this electrically conductive element being arranged on the contact region 330 of the upper side 321 of the lead frame section 320. There are therefore electrically conductive connections between the lower sides 312, 322, exposed on the lower side 202 of the molded body 200, of the lead frame sections 310, 320 and the electrical contact pads 510, 520 of the optoelectronic semiconductor chip 500, which makes it possible to electrically contact the optoelectronic semiconductor chip 500 via the lower sides 312, 322, exposed on the lower side 202 of the molded body 200 of the optoelectronic component 10, of the lead frame sections 310, 320.

Alternatively, the first electrical contact pad 510 of the optoelectronic semiconductor chip 500 is arranged not on the upper side 501 of the optoelectronic semiconductor chip 500, but on the lower side 502 of the optoelectronic semiconductor chip 500. In this example, an electrically conductive connection is established between the first electrical contact pad 510 of the optoelectronic semiconductor chip 500 and the first lead frame section 310 via the connecting material fastening the optoelectronic semiconductor chip 500 on the chip reception region 340. The electrically conductive element 400 arranged on the contact region 330 of the first lead frame section 310 may be omitted in this example.

The part of the molded body 200 covering the contact regions 330 of the upper sides 311, 321 of the lead frame sections 310, 320 may have a high optical reflectivity. In this way, electromagnetic radiation emitted by the optoelectronic semiconductor chip 500 in the direction of the bottom region of the cavity 210 may be reflected on the parts of the molded body 200 covering the contact regions 330 and be emitted from the optoelectronic component 10.

An encapsulation material may be arranged in the cavity 210. In this case, the optoelectronic semiconductor chip 500 and the bonding wires 600 are embedded in the encapsulation material and thereby protected against damage by external effects. The encapsulation material arranged in the cavity 210 may additionally comprise embedded scattering particles and/or embedded wavelength-converting particles. Wavelength-converting particles embedded in the encapsulation material may be provided to convert electromagnetic radiation emitted by the optoelectronic semiconductor chip 500 at least partially into electromagnetic radiation of another, typically longer, wavelength.

A variant of the method described with the aid of FIGS. 1 to 4 will be explained below with the aid of FIGS. 5 to 7. The method represented in FIGS. 5 to 7 has great similarities with the method shown in FIGS. 1 to 4. Only the differences between the method according to FIGS. 5 to 7 and the method according to FIGS. 1 to 4, as well as the differences between the optoelectronic components obtainable by the methods, will therefore be described below.

Figure 5:
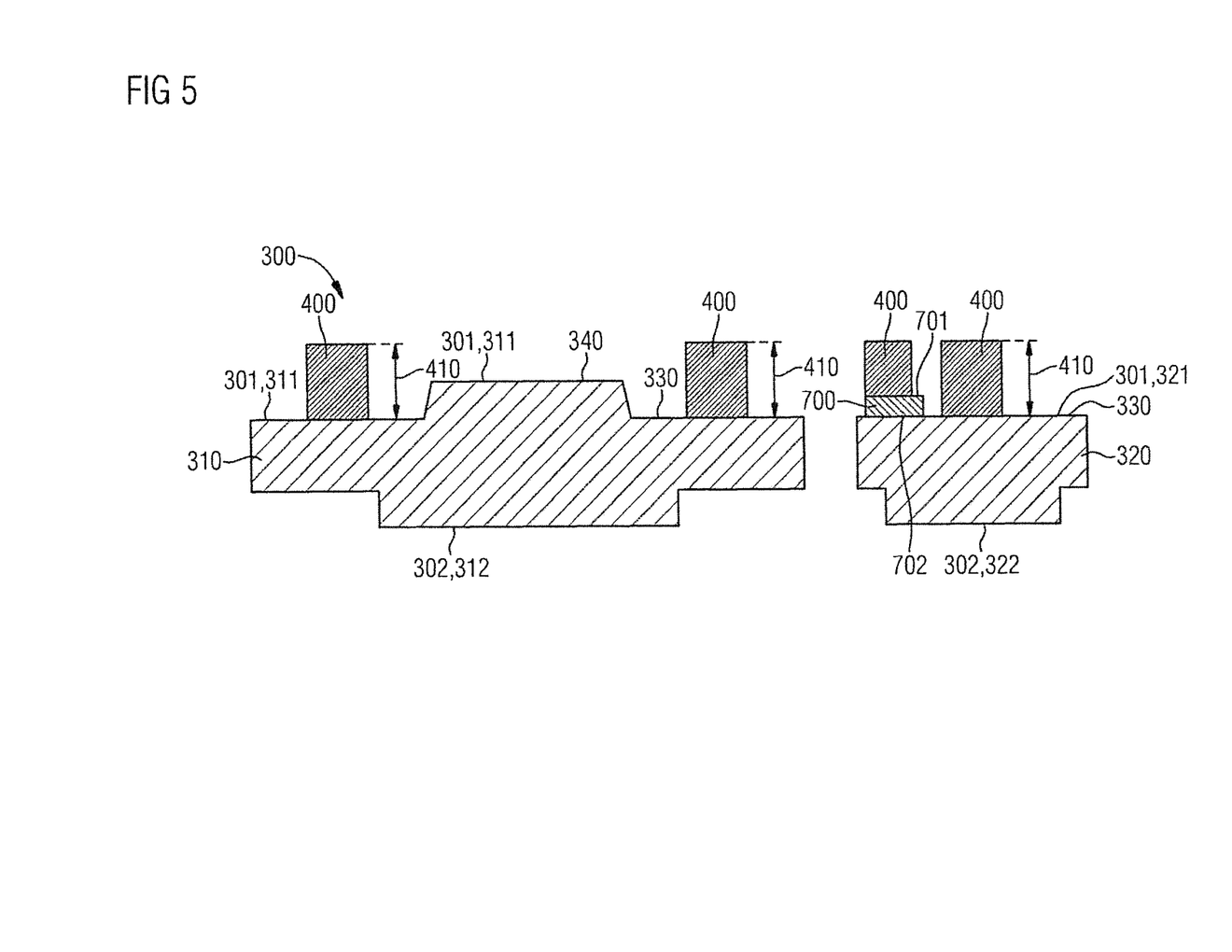
FIG. 5 schematically shows a sectional side view of the lead frame sections according to a second example.

FIG. 5 shows a schematic sectional side view of the first lead frame section 310 and the second lead frame section 320 of the lead frame 300. In contrast to the representation of FIG. 2, in the processing state shown in FIG. 5 two electrically conductive elements 400 are arranged on the contact region 330 of the upper side 311 of the first lead frame section 310. An electrically conductive element 400 is arranged on the contact region 330 of the upper side 321 of the second lead frame section 320.

In addition, a protective chip 700 is arranged on the contact region 330 of the upper side 321 of the second lead frame section 320. The protective chip 700 may be provided to protect the optoelectronic semiconductor chip 500 of the optoelectronic component 10 obtainable by the method against damage by electrostatic discharges. To this end, for example, the protective chip 700 may be configured as a protective diode. The protective chip 700 has an upper side 701 and a lower side 702 lying opposite the upper side 701. Electrical contact pads of the protective chip 700 are respectively formed on the upper side 701 and the lower side 702. The protective chip 700 is arranged on the contact region 330 of the upper side 321 of the second lead frame section 320 such that the lower side 702 of the protective chip 700 faces toward the upper side 321 of the lead frame section 320 and is in electrically conductive connection therewith. The protective chip 700 may, for example, be fastened on the upper side 321 of the second lead frame section 320 by an electrically conductive adhesive or a solder.

A further electrically conductive element 400 is arranged on the upper side 701 of the protective chip 700 and in electrically conductive connection with the electrical contact pad of the protective chip 700, which is formed on the upper side 701 of the protective chip 700. The electrically conductive element 400 on the upper side 701 of the protective chip 700 may be configured like the other electrically conductive elements 400 on the contact regions 330 of the upper sides 311, 321 of the lead frame sections 310, 320. The electrically conductive element 400 arranged on the upper side 701 of the protective chip 700 may also have a height, however, which is reduced relative to the height of the other electrically conductive elements 400 by the height of the protective chip 700.

Figure 6:
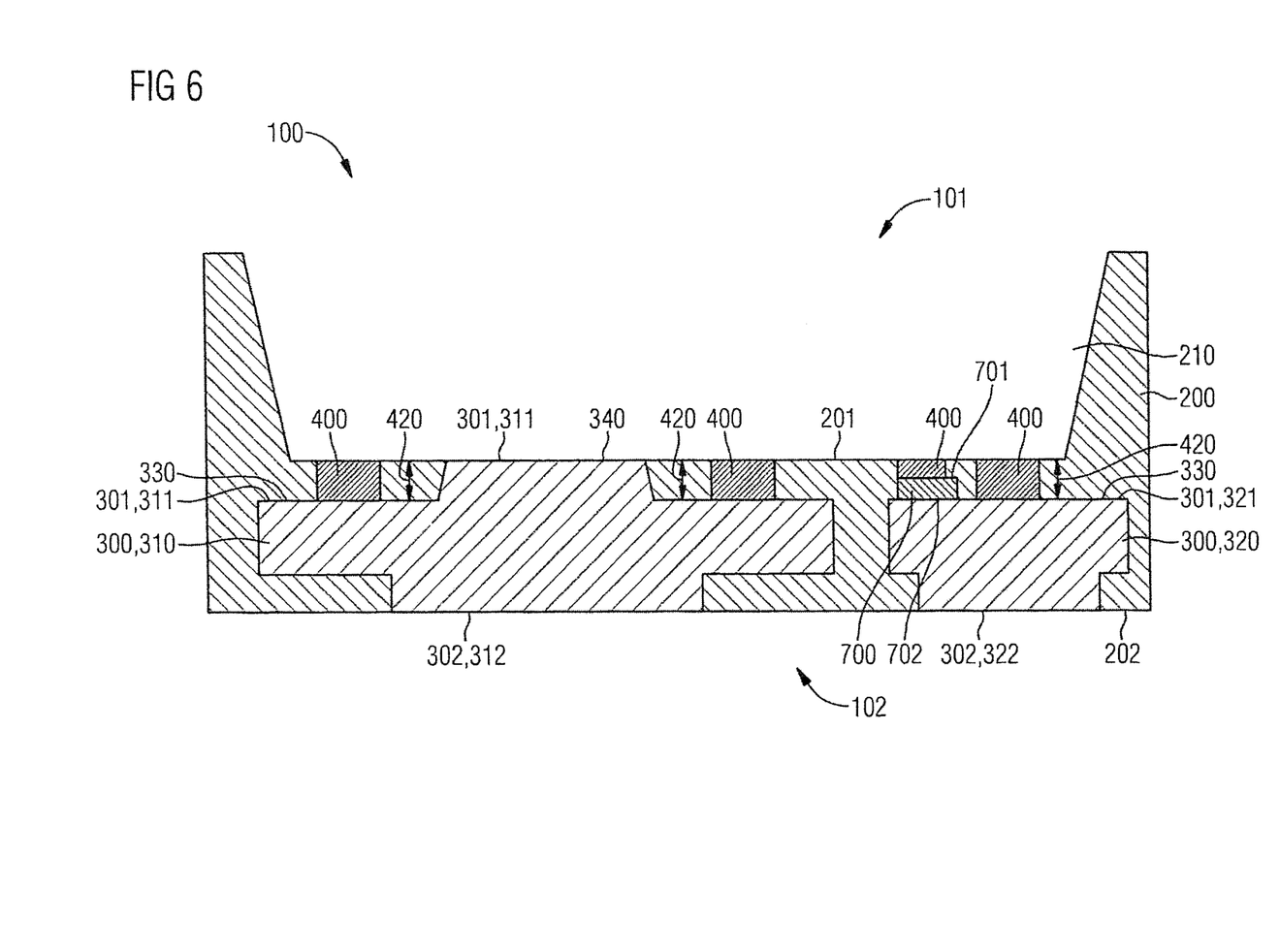
FIG. 6 schematically shows a sectional side view of the lead frame sections after embedding in the molded body.

FIG. 6 shows a schematic sectional side view of the carrier 100 formed by embedding the lead frame sections 310, 320 shown in FIG. 5 in the molded body in a processing state chronologically following the representation of FIG. 5.

Before formation of the molded body 200, the electrically conductive elements 400 have in turn all been pressed flat such that their upper side lies in a common plane with the chip reception region 340 of the upper side 311 of the first lead frame section 310. The molded body 200 has been formed so that the contact regions 330 of the upper sides 311, 321 of the lead frame sections 310, 320 are covered by the material of the molded body 200, but the chip reception region 340 and the electrically conductive elements 400 are accessible on the upper side 201 of the molded body 200 and are flush with the upper side 201 of the molded body 200. The protective chip 700 has also been embedded in the molded body 200.

Figure 7:
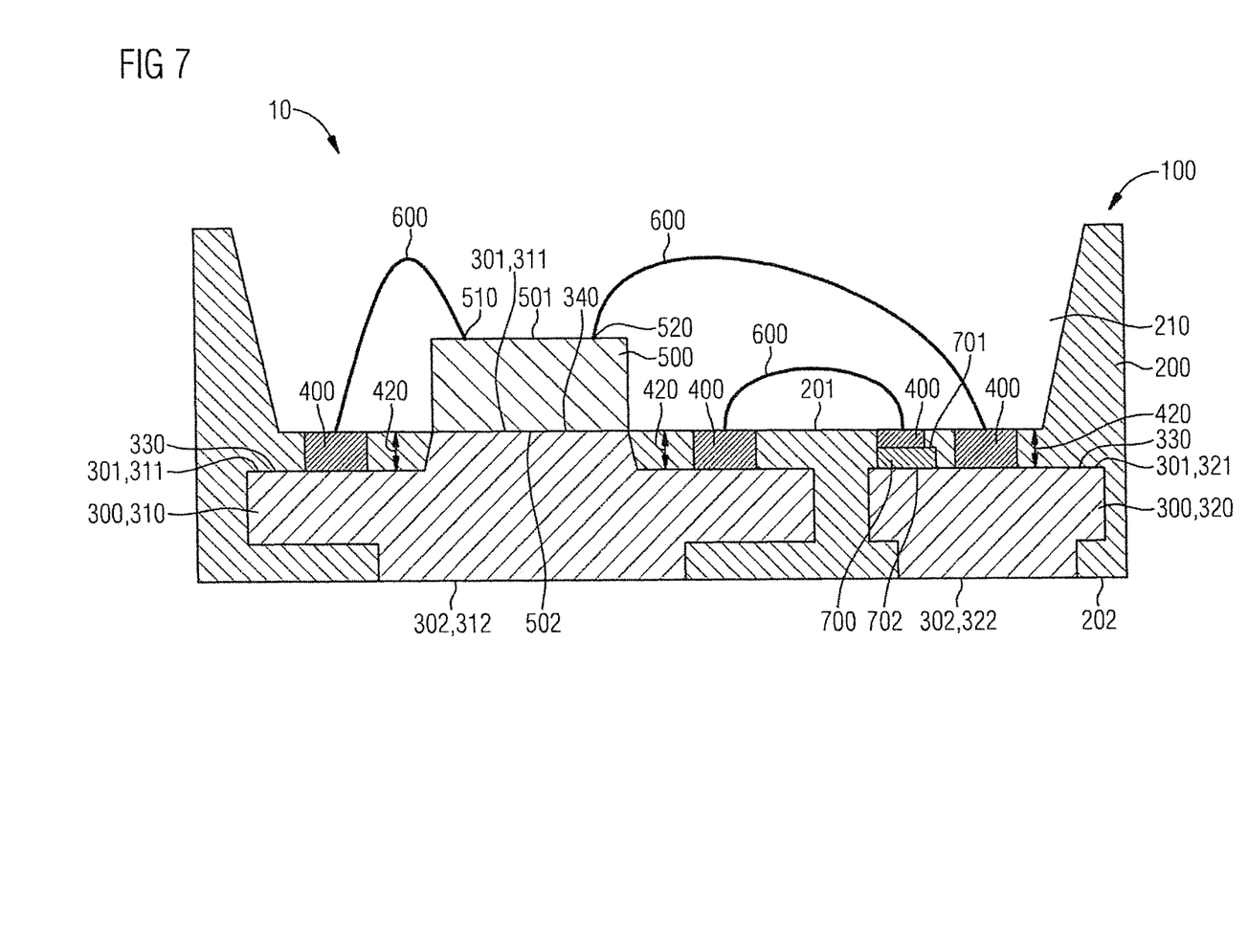
FIG. 7 schematically shows a sectional side view of the optoelectronic component in the second example.

FIG. 7 shows a schematic sectional side view of the optoelectronic component 10 formed from the carrier 100 in a processing state chronologically following the representation of FIG. 6.

The optoelectronic semiconductor chip 500 has also been arranged on the chip reception region 340 of the upper side 311 of the first lead frame section 310. The first electrical contact pad 510 and the second electrical contact pad 520 of the optoelectronic semiconductor chip 500 have been connected via bonding wires 600 to the electrically conductive elements 400 on the contact region 330 of the upper side 311 of the first lead frame section 310 and on the contact region 330 of the upper side 321 of the second lead frame section 320. In addition, the electrically conductive element 400 arranged on the upper side 701 of the protective chip 700 has been electrically conductively connected via a further bonding wire 600 to the further electrically conductive element 400 arranged on the contact region 330 of the upper side 311 of the first lead frame section 310. The protective chip 700 is therefore electrically connected in parallel with the optoelectronic semiconductor chip 500.

Figure 8:
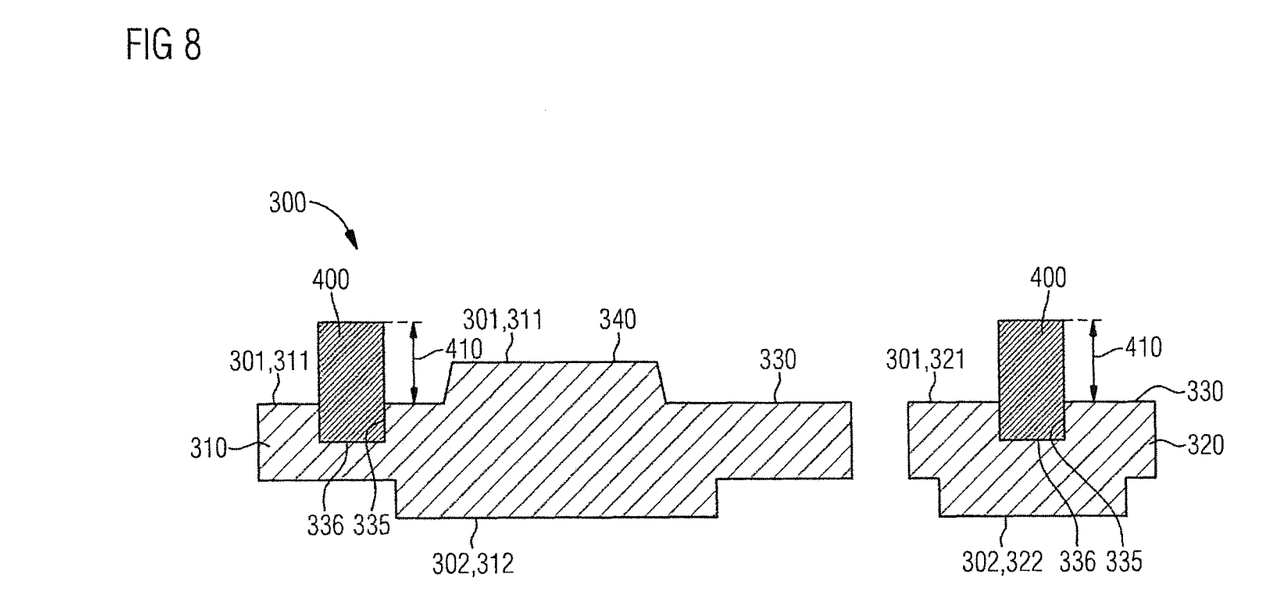
FIG. 8 schematically shows a sectional side view of the lead frame sections in a third example.

FIG. 8 shows a schematic sectional side view of the first lead frame section 310 and the second lead frame section 320 of the lead frame 300 according to another alternative example.

In contrast to the example represented in FIG. 2, the contact region 330 of the upper side 311 of the first lead frame section 310 and the contact region 330 of the upper side 321 of the second lead frame section 320 respectively comprise recesses 335 in the representation of FIG. 8. The recesses 335 may, for example, have been formed together with the openings of the lead frame 300, for instance by embossing or by etching.

In the example shown in FIG. 8, the electrically conductive elements 400 are arranged in the recesses 335 on the contact regions 330 of the upper sides 311, 321 of the lead frame sections 310, 320. The lateral positions of the electrically conductive elements 400 are thereby established, and there is no risk that the electrically conductive elements 400 will be displaced during the subsequent formation of the molded body 200.

The electrically conductive elements 400 may be additionally fastened in the recesses 335 by an electrically conductive bonding medium 336. The bonding medium 336 may, for example, be formed as a metal or as an electrically conductive adhesive. The bonding medium 336 may be used to establish a particularly reliable electrically conductive connection between the lead frame sections 310, 320 and the electrically conductive elements 400.

A bonding medium 336 arranged between the upper sides 311, 321 of the lead frame sections 310, 320 and the electrically conductive elements 400 may also be provided when the upper sides 311, 321 of the lead frame sections 310, 320 do not have recesses 335.

In the example shown in FIG. 8, the electrically conductive elements 400 may, as in the example shown in FIG. 2, be configured as bumps made of a soft material and have the first height 410, which is greater than the height by which the chip reception region 340 of the upper side 311 of the first lead frame section 310 is raised above the contact region 330 of the upper side 311 of the first lead frame section 310. As an alternative, however, the electrically conductive elements 400 may also be configured as metal pins. In this case, the electrically conductive elements 400 preferably have a height dimensioned such that the longitudinal ends of the pins facing away from the upper sides 311, 321 of the lead frame sections 310, 320 lies in a common plane with the chip reception region 340 of the upper side 311 of the first lead frame section 310.

The electrically conductive elements 400 may also be configured as pins when the upper sides 311, 321 of the lead frame sections 310, 320 do not have the recesses 335.

Figure 9:
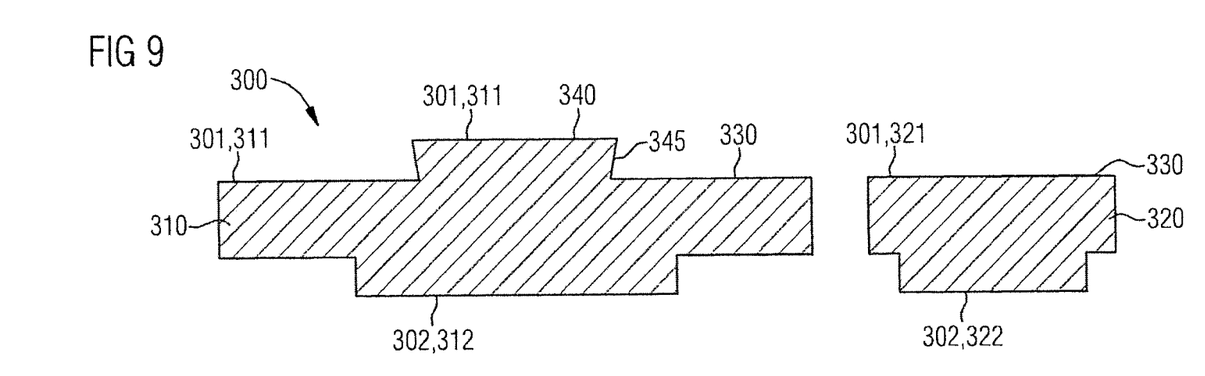
FIG. 9 schematically shows a sectional side view of the lead frame sections in a fourth example.

FIG. 9 shows a schematic sectional side view of the first lead frame section 310 and the second lead frame section 320 of the lead frame 300 according to another alternative example.

In contrast to the example shown in FIG. 1, the chip reception region 340 of the upper side 311 of the first lead frame section 310 of the example shown in FIG. 9 has an undercut 345 at the boundary with the contact region 330 of the upper side 311 of the first lead frame section 310. This means that the chip reception region 340 and the side faces of the raised chip reception region 340 connecting chip reception region 340 to the neighboring contact region 330 form an acute angle at least in sections. The effect which can be achieved by the undercut 345 is that the first lead frame section 310 of the lead frame 300 connects in a mechanically more robust way to the molded body 200 after embedding in the molded body 200. Furthermore, a risk that a part of the material of the molded body 200 will become placed on the chip reception region 340 of the upper side 311 of the first lead frame section 310, during embedding of the lead frame 300 in the molded body 200, can be reduced by the undercut 345.

As further measures of improving adhesion of the material of the molded body 200 to the lead frame sections 310, 320 of the lead frame 300, the upper sides 311, 321 and/or the lower sides 312, 322 of the lead frame sections 310, 320 of the lead frame 300 may be roughened before embedding the lead frame 300 in the molded body 200. Furthermore, the upper sides 311, 321 and/or the lower sides 312, 322 of the lead frame sections 310, 320 may be cleaned, for example, by a wet chemical method or using a plasma, before embedding the lead frame 300 in the molded body 200. In this way, the adhesion of the electrically conductive elements 400 to the contact regions 330 of the upper sides 311, 321 of the lead frame sections 310, 320 can also be improved.

Figure 10:
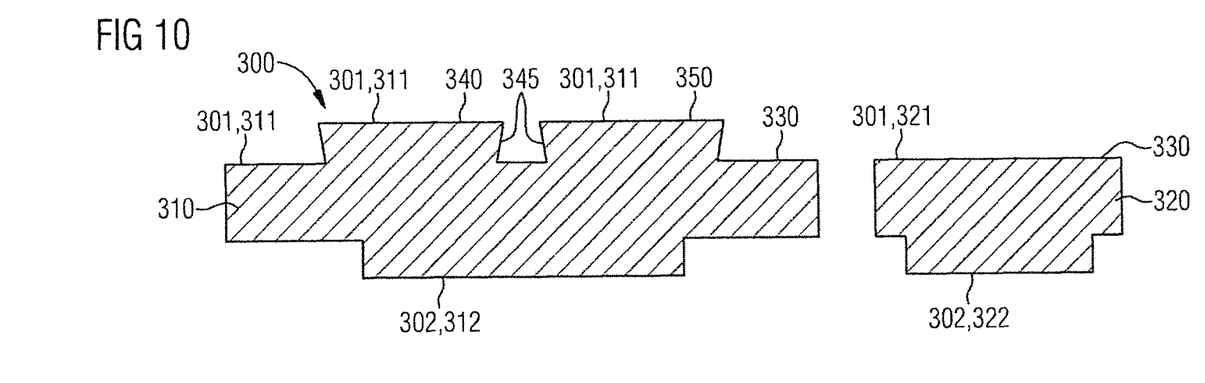
FIG. 10 schematically shows a sectional side view of the lead frame sections in a fifth example.

FIG. 10 shows a schematic sectional side view of the first lead frame section 310 and the second lead frame section 320 of the lead frame 300 according to another alternative example.

In contrast to the example shown in FIG. 1, the upper side 311 of the first lead frame section 310 of the lead frame 300 in the example shown in FIG. 10 comprises a further chip reception region 350 in addition to the chip reception region 340. The further chip reception region 350 is, like the chip reception region 340, raised above the contact region 330 of the upper side 311 of the first lead frame section 310. The chip reception region 340 and the further chip reception region 350 in this case lie in a common plane.

The further chip reception region 350 may be used to receive a further optoelectronic semiconductor chip 500 after embedding the lead frame 300 in the molded body 200. In this way, the optoelectronic component 10 obtainable by the method according to FIG. 10 may have two optoelectronic semiconductor chips 500. Of course, it is possible to configure the upper side 311 of the first lead frame section 310 with even more chip reception regions, which may be provided to receive even more optoelectronic semiconductor chips.

It would likewise be possible to configure the upper side 311 of the first lead frame section 310 of the lead frame 300 with only one chip reception region 340, but to configure the latter with a sufficiently large area for two or more optoelectronic semiconductor chips 500 to be arranged on the chip reception region 340.

Our components and methods have been illustrated and described in more detail with the aid of the preferred examples. This disclosure is not, however, restricted to the examples disclosed. Rather, other variants may be derived therefrom by those skilled in the art, without departing from the protective scope of the appended claims.

This application claims priority of DE 10 2015 109 876.8, the subject matter of which is incorporated herein by reference.

The invention claimed is:

1. A method of producing an optoelectronic component comprising:
   providing a lead frame having an upper side comprising a contact region and a chip reception region raised relative to the contact region;
   arranging an electrically conductive element on the contact region;
   embedding the lead frame in a molded body, wherein the contact region is covered by the molded body, and the chip reception region and the electrically conductive element remain accessible on an upper side of the molded body;
   arranging an optoelectronic semiconductor chip on the chip reception region; and
   connecting the optoelectronic semiconductor chip and the electrically conductive element by a bonding wire.

2. The method according to claim 1, wherein the electrically conductive element is arranged on the contact region such that it protrudes beyond the chip reception region, and the electrically conductive element is pressed flat before the embedding of the lead frame in the molded body such that the electrically conductive element has the same height as the chip reception region.

3. The method according to claim 2, wherein pressing the electrically conductive element flat is carried out by a closure pressure of a molding tool.

4. The method according to claim 1, wherein the electrically conductive element is arranged in a recess provided in the contact region.

5. The method according to claim 1, wherein the electrically conductive element is fixed on the contact region by an electrically conductive bonding medium.

6. The method according to claim 1,
   wherein the lead frame is provided having a first lead frame section and a second lead frame section,
   an electrically conductive element is respectively arranged on the upper side of the first lead frame section and on the upper side of the second lead frame section, and
   the two electrically conductive elements connect to the optoelectronic semiconductor chip via bonding wires.

7. The method according to claim 1 further comprising:
   arranging a protective chip on the upper side of the lead frame, the protective chip being embedded in the molded body.

8. An optoelectronic component comprising a carrier and an optoelectronic semiconductor chip, wherein the carrier comprises a lead frame embedded in a molded body, the lead frame comprises an upper side having a contact region and a chip reception region raised relative to the contact region, an electrically conductive element is arranged on the contact region, the contact region is covered by the molded body, the chip reception region and the electrically conductive element are accessible on an upper side of the molded body, and the optoelectronic semi-conductor chip is arranged on the chip reception region and connects to the electrically conductive element by a bonding wire.

9. The optoelectronic component according to claim 8, wherein the chip reception region is flush with a section of the upper side of the molded body.

10. The optoelectronic component according to claim 8, wherein the chip reception region has an undercut at the boundary with the contact region.

11. The optoelectronic component according to claim 8, wherein the molded body forms a cavity on its upper side, and the optoelectronic semiconductor chip is arranged in the cavity.

12. The optoelectronic component according to claim 8, wherein the lead frame is accessible on a lower side, lying opposite the upper side, of the molded body.

13. The optoelectronic component according to claim 8, wherein the optoelectronic component comprises a further optoelectronic semiconductor chip.

14. The optoelectronic component according to claim 13, wherein the lead frame comprises a further chip reception region raised relative to the contact region, and the further optoelectronic semiconductor chip is arranged on the further chip reception region.

* * * * *